(12) United States Patent
Koo et al.

(10) Patent No.: US 10,134,568 B2
(45) Date of Patent: Nov. 20, 2018

(54) RF ION SOURCE WITH DYNAMIC VOLUME CONTROL

(71) Applicant: Varian Semiconductor Equipment Associates, Inc., Gloucester, MA (US)

(72) Inventors: Bon-Woong Koo, Andover, MA (US); Yong-Seok Hwang, Seoul (KR); Kyong-Jae Chung, Seoul (KR)

(73) Assignee: VARIAN SEMICONDUCTOR EQUIPMENT ASSOCIATES, INC., Gloucester, MA (US)

( * ) Notice: Subject to any disclaimer, the term of this patent is extended or adjusted under 35 U.S.C. 154(b) by 0 days.

(21) Appl. No.: 15/863,326

(22) Filed: Jan. 5, 2018

(65) Prior Publication Data

US 2018/0138020 A1 May 17, 2018

Related U.S. Application Data

(63) Continuation of application No. 15/341,040, filed on Nov. 2, 2016, now Pat. No. 9,899,193.

(51) Int. Cl.
*H01J 37/32* (2006.01)
*H01J 27/16* (2006.01)
*H01J 37/08* (2006.01)

(52) U.S. Cl.
CPC ........ *H01J 37/32458* (2013.01); *H01J 27/16* (2013.01); *H01J 37/08* (2013.01);
(Continued)

(58) Field of Classification Search
CPC ............. H01J 37/3211; H01J 37/32412; H01J 37/32422; H01J 37/3244; H01J 37/32458;
(Continued)

(56) References Cited

U.S. PATENT DOCUMENTS

| 2,043,777 A | 6/1936 | Schellenger |
| 2,284,132 A | 5/1942 | Chereton |

(Continued)

FOREIGN PATENT DOCUMENTS

| WO | 2006078585 A2 | 7/2006 |
| WO | 2013085254 A1 | 6/2013 |
| WO | 2014143505 A1 | 9/2014 |

OTHER PUBLICATIONS

Kyoung-Jae Chung et al., "Effects of Discharge Chamber Length on a Negative Ion Generation in Volume Produced Negative Hydrogen Ion Source," Review of Scientific Instruments, 2014, 02B119, vol. 85, AIP.

(Continued)

*Primary Examiner* — Haissa Philogene

(57) ABSTRACT

Provided herein are approaches for dynamically modifying plasma volume in an ion source chamber by positioning an end plate and radio frequency (RF) antenna at a selected axial location. In one approach, an ion source includes a plasma chamber having a longitudinal axis extending between a first end wall and a second end wall, and an RF antenna adjacent a plasma within the plasma chamber, wherein the RF antenna is configured to provide RF energy to the plasma. The ion source may further include an end plate disposed within the plasma chamber, adjacent the first end wall, the end plate actuated along the longitudinal axis between a first position and a second position to adjust a volume of the plasma. By providing an actuable end plate and RF antenna, plasma characteristics may be dynamically controlled to affect ion source characteristics, such as composition of ion species, including metastable neutrals.

20 Claims, 5 Drawing Sheets

(52) U.S. Cl.
CPC ......... *H01J 37/321* (2013.01); *H01J 37/3211* (2013.01); *H01J 37/3244* (2013.01); *H01J 37/32412* (2013.01); *H01J 37/32422* (2013.01); *H01J 37/32449* (2013.01); *H01J 37/32623* (2013.01); *H01J 37/32669* (2013.01); *H01J 2237/327* (2013.01); *H01J 2237/3365* (2013.01)

(58) Field of Classification Search
CPC .... H01J 37/32669; H01J 27/02; H01J 37/321; H01J 37/32449; H01J 37/32623; H01J 2237/3365; H01J 2237/327
See application file for complete search history.

(56) References Cited

U.S. PATENT DOCUMENTS

| | | |
|---|---|---|
| 2,337,457 A | 12/1943 | Dzus |
| 2,713,173 A | 7/1955 | Runcie |
| 2,723,340 A | 11/1955 | Boggs et al. |
| 2,742,543 A | 4/1956 | Hurd |
| 2,923,785 A | 2/1960 | Longenecker |
| 2,946,905 A | 7/1960 | Jolly |
| 2,997,682 A | 8/1961 | Grimes et al. |
| 3,056,879 A | 10/1962 | Fischer |
| 3,059,168 A | 10/1962 | Sones et al. |
| 3,108,172 A | 10/1963 | Edwards |
| 3,109,997 A | 11/1963 | Giger et al. |
| 3,223,960 A | 12/1965 | Ruehlemann |
| 3,247,344 A | 4/1966 | Russell |
| 3,295,092 A | 12/1966 | Newman et al. |
| 3,341,851 A | 9/1967 | Tracey et al. |
| 3,345,561 A | 10/1967 | Martin |
| 3,387,116 A | 6/1968 | Dupuis |
| 3,416,125 A | 12/1968 | Theve |
| 3,502,834 A | 3/1970 | Field et al. |
| 3,733,568 A | 5/1973 | Prouty et al. |
| 3,764,871 A | 10/1973 | Scheuer et al. |
| 3,889,133 A | 6/1975 | Oka et al. |
| 3,932,711 A | 1/1976 | OBrien et al. |
| 4,017,714 A | 4/1977 | Kreiser |
| 4,022,594 A | 5/1977 | Baysek |
| 4,032,775 A | 6/1977 | Bobrick et al. |
| 4,058,701 A | 11/1977 | Gruber et al. |
| 4,097,919 A | 6/1978 | Bobrick et al. |
| 4,145,107 A | 3/1979 | De Haitre |
| 4,178,495 A | 12/1979 | Spisak et al. |
| 4,211,625 A | 7/1980 | Vandevier et al. |
| 4,238,788 A | 12/1980 | Rosauer et al. |
| 4,323,871 A | 4/1982 | Kamp et al. |
| 4,359,764 A | 11/1982 | Block |
| 4,388,947 A | 6/1983 | Steuerwald |
| 4,488,209 A | 12/1984 | Gosswiller |
| 4,513,214 A | 4/1985 | Dieringer |
| 4,513,347 A | 4/1985 | Wilcox et al. |
| 4,528,439 A | 7/1985 | Marney, Jr. et al. |
| 4,560,926 A | 12/1985 | Cornu et al. |
| 4,568,804 A | 2/1986 | Luehring |
| 4,848,616 A | 7/1989 | Nozaki |
| 4,904,935 A | 2/1990 | Calma et al. |
| 4,918,384 A | 4/1990 | Gringer et al. |
| 4,935,696 A | 6/1990 | DiPerna |
| 5,067,906 A | 11/1991 | Woodgate |
| 5,149,282 A | 9/1992 | Donato et al. |
| 5,290,980 A | 3/1994 | Cummings |
| 5,335,311 A | 8/1994 | Groothuizen |
| 5,387,138 A | 2/1995 | O'Malley |
| 5,517,084 A | 5/1996 | Leung |
| 5,548,164 A | 8/1996 | Hillard et al. |
| 5,557,213 A | 9/1996 | Reuter et al. |
| 5,598,318 A | 1/1997 | Dewitt et al. |
| 5,628,644 A | 5/1997 | Szalay et al. |
| 5,749,754 A | 5/1998 | Patterson et al. |
| 5,771,974 A | 6/1998 | Stewart et al. |
| 5,804,984 A | 9/1998 | Alcoe et al. |
| 5,898,983 A | 5/1999 | Sooy et al. |
| 5,936,421 A | 8/1999 | Stowers et al. |
| 5,980,266 A | 11/1999 | Hsu |
| 6,019,164 A | 2/2000 | Getchel et al. |
| 6,071,144 A | 6/2000 | Tang |
| 6,112,769 A | 9/2000 | Nicholson et al. |
| 6,153,859 A | 11/2000 | Taylor et al. |
| 6,190,181 B1 | 2/2001 | Affolter et al. |
| 6,205,160 B1 | 3/2001 | Grewell |
| 6,208,158 B1 | 3/2001 | Schein et al. |
| 6,222,377 B1 | 4/2001 | Kato |
| 6,271,672 B1 | 8/2001 | Swart et al. |
| 6,328,096 B1 | 12/2001 | Stone et al. |
| 6,365,349 B1 | 4/2002 | Moynihan et al. |
| 6,377,059 B2 | 4/2002 | Vinther et al. |
| 6,390,826 B1 | 5/2002 | Affolter et al. |
| 6,424,163 B1 | 7/2002 | Ott |
| 6,511,335 B1 | 1/2003 | Rayssiguier et al. |
| 6,533,594 B1 | 3/2003 | Kurup |
| 6,561,848 B1 | 5/2003 | Khemakhem et al. |
| 6,575,786 B1 | 6/2003 | Khemakhem et al. |
| 6,634,902 B1 | 10/2003 | Pirovic |
| 6,679,724 B2 | 1/2004 | Hillman et al. |
| 6,685,150 B2 | 2/2004 | Anderson |
| 6,702,613 B2 | 3/2004 | Khemakhem et al. |
| 6,716,038 B2 | 4/2004 | Garcia |
| 6,737,878 B2 | 5/2004 | Kagami |
| 6,783,395 B2 | 8/2004 | Khemakhem et al. |
| 6,788,966 B2 | 9/2004 | Kenan et al. |
| 6,808,021 B2 | 10/2004 | Zimmerman et al. |
| 6,809,535 B2 | 10/2004 | Campbell |
| 6,844,749 B2 | 1/2005 | Sinclair |
| 6,846,988 B2 | 1/2005 | Khemakhem et al. |
| 6,884,114 B2 | 4/2005 | Khemakhem et al. |
| 6,929,484 B2 | 8/2005 | Weiss et al. |
| 7,029,325 B2 | 4/2006 | Khemakhem et al. |
| 7,140,105 B2 | 11/2006 | Campbell |
| 7,140,912 B2 | 11/2006 | Khemakhem et al. |
| 7,176,469 B2 | 2/2007 | Leung |
| 7,197,821 B2 | 4/2007 | Khemakhem et al. |
| 7,261,162 B2 | 8/2007 | Deans et al. |
| 7,279,912 B2 | 10/2007 | Leon |
| 7,281,948 B2 | 10/2007 | Khemakhem et al. |
| 7,295,013 B2 | 11/2007 | Conti et al. |
| 7,298,153 B2 | 11/2007 | Farris et al. |
| 7,480,991 B2 | 1/2009 | Khemakhem et al. |
| 7,602,203 B2 | 10/2009 | Takekoshi |
| 7,626,408 B1 | 12/2009 | Kaashoek |
| 7,736,202 B1 | 6/2010 | Kaiser et al. |
| 7,762,852 B2 | 7/2010 | Daly et al. |
| 7,837,518 B2 | 11/2010 | Nicholson |
| 7,863,582 B2 | 1/2011 | Godyak |
| 7,947,965 B2 | 5/2011 | Peters |
| 8,493,085 B2 | 7/2013 | Barabi et al. |
| 8,593,064 B2 * | 11/2013 | Chang Diaz .......... F03H 1/0093 315/111.61 |
| 8,835,869 B2 | 9/2014 | Yevtukhov |
| 8,900,000 B2 | 12/2014 | Cairns |
| 9,046,568 B2 | 6/2015 | Ho et al. |
| 9,184,533 B2 | 11/2015 | Wyatt |
| 9,246,272 B2 | 1/2016 | Kitchen et al. |
| 9,310,395 B2 | 4/2016 | Lee |
| 9,899,193 B1 * | 2/2018 | Koo ................... H01J 37/3211 |
| 2003/0135999 A1 | 7/2003 | Khemakhem et al. |
| 2003/0211777 A1 | 11/2003 | Khemakhem et al. |
| 2004/0023530 A1 | 2/2004 | Garcia |
| 2004/0023554 A1 | 2/2004 | Khemakem et al. |
| 2004/0161971 A1 | 8/2004 | Khemakhem et al. |
| 2004/0219807 A1 | 11/2004 | Weiss et al. |
| 2005/0022387 A1 | 2/2005 | Severa et al. |
| 2005/0161246 A1 | 7/2005 | Khemakhem et al. |
| 2005/0176293 A1 | 8/2005 | Khemakhem et al. |
| 2005/0189115 A1 | 9/2005 | Rytlewski et al. |
| 2006/0003626 A1 | 1/2006 | Roberts |
| 2006/0063426 A1 | 3/2006 | Khemakhem et al. |
| 2006/0226842 A1 | 10/2006 | Conti et al. |
| 2007/0037446 A1 | 2/2007 | Khemakhem et al. |
| 2007/0175027 A1 | 8/2007 | Khemakhem et al. |
| 2008/0265563 A1 | 10/2008 | Nicholson |

(56) References Cited

U.S. PATENT DOCUMENTS

| | | |
|---|---|---|
| 2009/0047815 A1 | 2/2009 | Nicholson |
| 2009/0295388 A1 | 12/2009 | Zhang et al. |
| 2012/0142210 A1 | 6/2012 | Di Stefano |
| 2013/0101241 A1 | 4/2013 | Hou et al. |
| 2013/0330944 A1 | 12/2013 | Rucki et al. |
| 2014/0332161 A1 | 11/2014 | Ricci et al. |

OTHER PUBLICATIONS

B. K. Jung et al., "Development of Novel Radio-Frequency Negative Hydrogen Ion Source in Conically Converging Configuration," Review of Scientific Instruments, 2014, 02B112, vol. 85, AIP.

S. J. Yoo et al., "Hyperthermal Neutral Beam Sources for Material Processing," Review of Scientific Instruments, 2008, 02C301, vol. 79, AIP.

\* cited by examiner

RF ION SOURCE WITH DYNAMIC VOLUME CONTROL

CROSS-REFERENCE TO RELATED APPLICATIONS

This is a continuation of pending U.S. non-provisional patent application Ser. No. 15/341,040, filed Nov. 2, 2016, the entire contents of the applications incorporated by reference herein.

FIELD OF THE DISCLOSURE

The disclosure relates generally to ion sources, and more particularly to an ion source having components for dynamically modifying plasma chamber volume.

BACKGROUND OF THE DISCLOSURE

Ion implantation is a process of introducing dopants or impurities into a substrate via bombardment. In semiconductor manufacturing, the dopants are introduced to alter electrical, optical, or mechanical properties. For example, dopants may be introduced into an intrinsic semiconductor substrate to alter the type and level of conductivity of the substrate. In manufacturing an integrated circuit (IC), a precise doping profile provides improved IC performance. To achieve a particular doping profile, one or more dopants may be implanted in the form of ions in various doses and various energy levels.

The beam line components of an ion implanter may include a series of electrodes configured to extract ions from the source chamber, a mass analyzer configured with a particular magnetic field where just ions having a desired mass-to-charge ratio are allowed to pass through the analyzer, and a corrector magnet configured to provide a ribbon beam directed to the platen almost orthogonally with respect to the ion beam to implant the ions into a target substrate. The ions lose energy when the ions collide with nuclei and electrons in the substrate and come to rest at a desired depth within the substrate based on the acceleration energy. The depth of implantation into the substrate is a function of ion energy and the mass of the ions generated in the source chamber. In some approaches, arsenic or phosphorus may be doped to form n-type regions in a substrate, and boron, gallium, or indium may be doped to create p-type regions in a substrate.

Various types of ion sources may be employed for ionizing feed gases. Such sources may be selected based on the type of plasma intended as well as an associated ion beam profile for implantation into a target substrate. One type of ion source is a hot-cathode ion source utilizing an indirectly heated cathode (IHC) to ionize a feed gas in a source chamber. Another type of ion source is an inductively-coupled, RF (radio frequency) plasma ion source utilizing an RF coil to excite, through electromagnetic induction, a feed gas in a source chamber. A dielectric RF window separates the interior of the source chamber from the RF coil, in some cases, at atmospheric pressure. The power delivered to the RF coil can be adjusted to control the density of the plasma and the extracted ion beam current. Due to inherent weaknesses such as low fractionation of the monoatomic ion species, low power density and low temperature operation, RF ion sources face challenges.

SUMMARY

In view of the foregoing, what is needed are systems and methods for dynamically modifying plasma characteristics in an RF ion source by positioning an end plate and RF antenna at a selected axial location of a plasma chamber. In one approach, an ion source includes a plasma chamber having a longitudinal axis extending between a first end wall and a second end wall, and an RF antenna adjacent a plasma within the plasma chamber, wherein the RF antenna is configured to provide RF energy to the plasma. The ion source may further include an end plate disposed within the plasma chamber, adjacent the first end wall, the end plate actuated along the longitudinal axis between a first position and a second position to adjust a volume of the plasma. By providing an actuable end plate and RF antenna, dynamically controlling plasma characteristics is possible, as is the ability to affect ion source characteristics, such as composition of ion species including metastable neutrals.

An exemplary ion source according to embodiments of the disclosure may include a plasma chamber having a longitudinal axis extending between a first end wall and a second end wall. The ion source may further include an end plate disposed within the plasma chamber, the end plate actuated along the longitudinal axis between a first position and a second position to adjust a volume of the plasma, wherein the end plate includes an internal fluid passageway operable to deliver a gas into the plasma chamber.

An exemplary plasma chamber in accordance with the present disclosure may include a housing comprising a side wall, a first end wall, and a second end wall, wherein the second end wall includes an exit aperture for delivering an ion beam from the plasma chamber. The plasma chamber may further include an end plate disposed within the plasma chamber, the end plate actuated along the longitudinal axis between a first position and a second position to adjust a volume of the plasma, wherein the end plate includes an internal fluid passageway operable to deliver a gas into the plasma chamber.

An exemplary method in accordance with the present disclosure may include providing a plasma chamber having a longitudinal axis extending between a first end wall and a second end wall. The method may further include providing an end plate within the plasma chamber, the end plate actuable along the longitudinal axis between a first position and a second position to adjust a volume of the plasma. The method may further include introducing a gas to the plasma chamber through an internal fluid passageway formed through the end plate.

Figure 1:
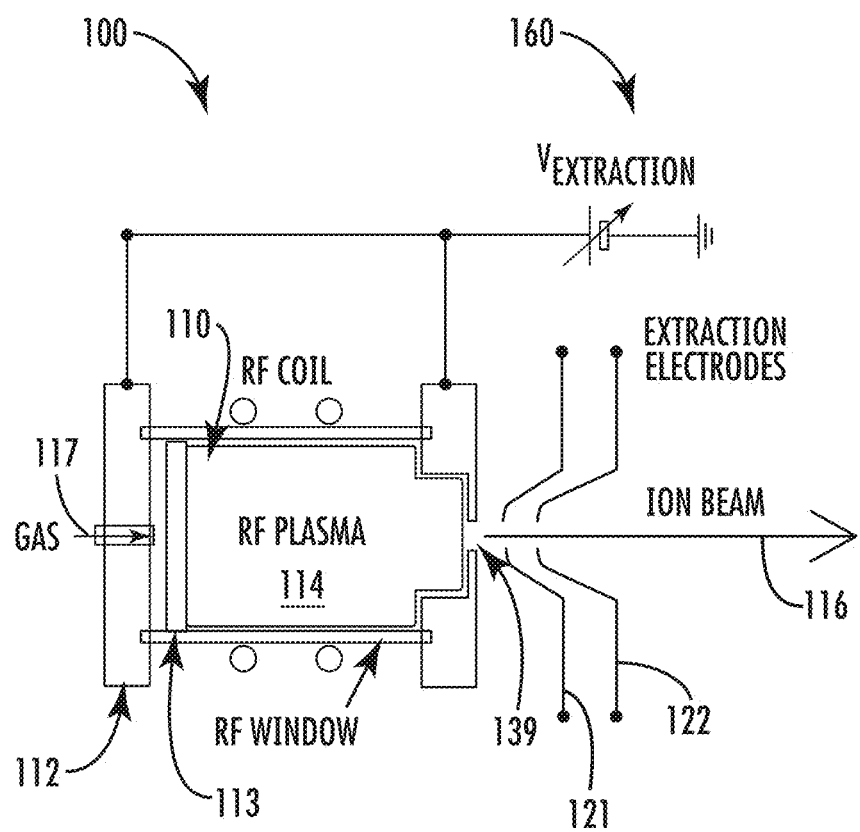
FIG. 1 is a side cross-sectional view of an ion source in accordance with an embodiment of the present disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

DETAILED DESCRIPTION

A system and method in accordance with the present disclosure will now be described more fully hereinafter with reference to the accompanying drawings, where embodiments of the system and method are shown. The system and method may be embodied in many different forms and are not to be construed as being limited to the embodiments set forth herein. Instead, these embodiments are provided so this disclosure will be thorough and complete, and will fully convey the scope of the system and method to those skilled in the art.

For the sake of convenience and clarity, terms such as "top," "bottom," "upper," "lower," "vertical," "horizontal," "lateral," and "longitudinal" will be used herein to describe the relative placement and orientation of these components and their constituent parts, with respect to the geometry and orientation of a component of a semiconductor manufacturing device as appearing in the figures. The terminology will include the words specifically mentioned, derivatives thereof, and words of similar import.

As used herein, an element or operation recited in the singular and proceeded with the word "a" or "an" are understood as potentially including plural elements or operations as well. Furthermore, references to "one embodiment" of the present disclosure are not intended to be interpreted as precluding the existence of additional embodiments also incorporating the recited features.

As stated above, provided herein are approaches for dynamically modifying plasma volume in an ion source chamber by positioning an end plate and radio frequency (RF) antenna at a selected axial location. In one approach, an ion source includes a plasma chamber having a longitudinal axis extending between a first end wall and a second end wall, and an RF antenna adjacent a plasma within the plasma chamber, wherein the RF antenna is configured to provide RF energy to the plasma. The ion source may further include an end plate disposed within the plasma chamber, adjacent the first end wall, the end plate actuated along the longitudinal axis between a first position and a second position to adjust a volume of the plasma. By providing an actuable end plate and RF antenna, dynamic control of plasma characteristics is achievable, as is the modification of ion source characteristics, such as composition of ion species, plasma density, electron temperature, and also including metastable neutrals.

Furthermore, approaches herein provide an end plate made of either an electrically conducting material (e.g. doped Si, doped SiC, Aluminum, Tungsten) or an insulating material (e.g., Si, SiC, ceramics). The end plate may also be used as a gas baffle for introducing a dopant gas either uniformly or along an outer region (e.g., closer to the RF coil) for improved power coupling. In some embodiments, the end plate can be biased, either positively or negatively, to control the plasma characteristics further. For example, the end plate can be RF biased using either low frequency (kHz range) or high frequency (MHz) range. In other examples, plasma volume may be set to a maximum if molecular ion species are intended, such as $BF_2^+$, $N_2^+$, dimers ($P_2^+$, $As_2^+$, $B_2^+$), or trimers ($P_3^+$, $As_3^+$). In contrast, if monoatomic ion species, such as $B^+$ or $N^+$ are desired, the plasma chamber volume is set to a minimum by moving the end plate towards the exit opening (e.g., orifice or slit) of the plasma chamber in order to maximize the power density and change the ratio of the plasma volume to boundary area.

In addition, a bias voltage can be applied to the end plate in order to further control the plasma characteristics. The end plate can be fabricated with the desired dopant containing material (e.g. boron carbide, $LaB_6$, GaN). In such cases, the desired dopant material can be sputtered via ion bombardment by negative bias on the end plate, ionized in the plasma, and then extracted as an ion beam. This phenomenon can increase the desired ion beam current. In other cases, where dopant material needs special delivery, such as when Ga is a liquid metal and therefore hard to feed into the plasma chamber for ionization, an end plate having the desired dopant material sputtered via ion bombardment can be used to create and extract the desired ion species. The positively bias voltage can be applied to the end plate, thus altering the plasma potential and electron temperature and, serving as an alternative way to tune the plasma parameters for an optimal condition. Also, RF bias can be applied to the end plate, either kHz range or MHz range, to establish a self-bias voltage (e.g., negative) on the end plate. The benefit of RF bias on the end plate is the ability to use electrically conducting and/or electrically insulating materials as an end plate.

Furthermore, approaches herein may be applied to a negative ion source. For example, a hot plasma characteristics in a driver region of the negative ion source can be adjusted by positioning and bias voltage of the end plate and the RF antenna. For $H^-$ beam generation, high-density and high $T_e$ (electron temperature) plasma may be generated in the driver region. In addition, an extra electrode with negative voltage bias can be added near the end plate to generate additional surface-produced $H^-$ ions with appropriate materials such as tantalium. For other negative ion species (e.g. $He^-$, $O^-$, $F^-$, $Cl^-$), the plasma chamber volume could similarly be adjusted for optimal effect.

Figure 2:
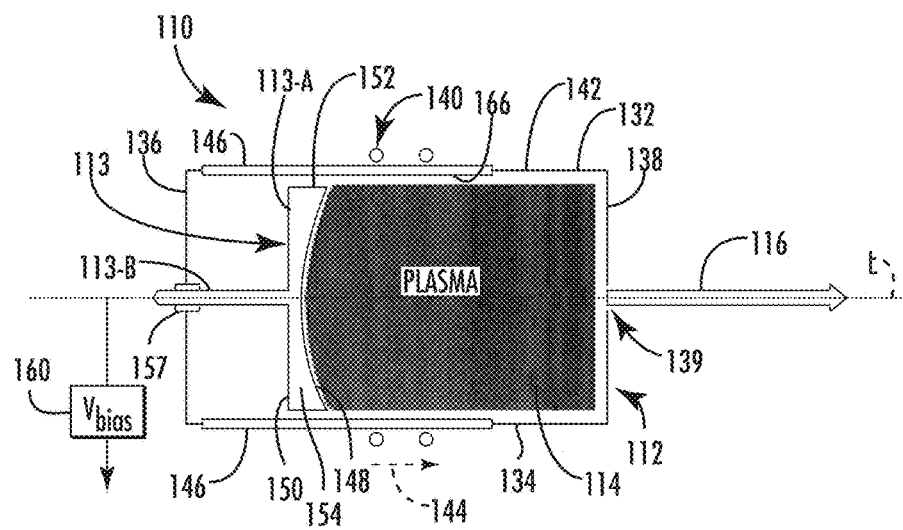
FIG. 2 is a side cross-sectional view of a plasma chamber in accordance with an embodiment of the present disclosure.

Referring now to FIGS. 1-2, an exemplary embodiment demonstrating an ion source 100 for dynamically modifying plasma volume in an ion source chamber in accordance with the present disclosure is shown. The ion source 100 represents an apparatus containing, among other components, a plasma chamber 110 including a housing 112, wherein the plasma chamber 110 producing a plasma 114 and allowing extraction of an ion beam 116 through an exit aperture 139 (e.g., an extraction orifice or slit). The plasma chamber 110 includes an end plate 113 disposed therein, for adjusting the volume of the plasma 114. The plasma chamber 110 is configured to receive a flow of gas 117, and generate ions therein. The ion source 100 may also comprise a power source and a set of electrodes disposed near the plasma chamber 110. In some embodiments, the ion source 100 may include a voltage source 160 and one or more extraction electrodes 121 and 122, wherein the voltage source is electrically coupled to the housing 112, for example as demonstrated in FIG. 1, or to the end plate 113, for example as demonstrated in FIG. 2.

In various embodiments, different species may be introduced via the gas 117. Examples of the source and/or additional material may include atomic or molecular species containing boron (B), carbon (C), oxygen (O), germanium (Ge), phosphorus (P), arsenic (As), silicon (Si), helium (He), neon (Ne), argon (Ar), krypton (Kr), nitrogen (N), hydrogen (H), fluorine (F), and chlorine (Cl). Those of ordinary skill in the art will recognize the above listed species are non-limiting, and other atomic or molecular species may also be used. Depending on the application(s), the species may be used as the dopants or the additional material. In particular, one species used as the dopants in one application may be used as the additional material in another application, or vice-versa.

Although not shown, the ion source 100 may further include one or more magnets formed around the plasma chamber 110. In some embodiments, the ion source 100 includes a filter magnet (e.g., transverse magnet) within the housing 112 for producing an electron filter field within the plasma. In other embodiments, the ion source 100 may further include a plurality of pole cusp magnets provided adjacent the filter magnet.

Referring now to FIG. 2, the plasma chamber 110 according to exemplary embodiments will be described in greater detail. As shown, the plasma chamber 110 includes a housing having a first side wall 132, a second side wall 134, a first end wall 136, and a second end wall 138, wherein an exit aperture 139 (e.g., opening or slit) is formed through the second end wall 138 to allow extraction of the ion beam 116 therefrom. In cases where the plasma chamber 110 is cylindrical, one will appreciate the first side wall 132 and the second side wall 134 may be considered joined/continuous.

The plasma chamber 110 further includes a radio frequency (RF) antenna, shown as RF antenna 140, (e.g., a coil) provided adjacent an exterior surface 142 of the plasma chamber 110, wherein the RF antenna 140 is connected to a RF supply (not shown). The RF antenna 140 is provided to excite, through electromagnetic induction, the gas in the plasma chamber 110, and to control the density of the plasma 114 and a current of the extracted ion beam 116. In exemplary embodiments, the RF antenna 140 is actuable along the exterior surface 142, between the first end wall 136 and the second end wall 138, for example, as indicated by arrow 144. The plasma chamber 110 may include an RF window 146 formed along at least one of the first side wall 132 and the second side wall 134, wherein the RF antenna 140 is disposed adjacent the RF window 146. During operation, ions are produced in the plasma chamber 110 by inductively coupling RF power from the RF antenna 140 into the gas within the plasma chamber 110. In one embodiment, RF power frequency can vary, for example, between 2 MHz 40 MHz. The ions are then extracted through the exit aperture 139 as the ion beam 116. The ions can be positive or negative in various embodiments.

As further shown, the plasma chamber 110 includes the end plate 113 disposed therein. The end plate 113 is actuable along the longitudinal axis 'L' of the plasma chamber 110, between the first end wall 136 and the second end wall 138, to adjust a volume of the plasma 114 contained therein. In one embodiment, end plate 113 includes a first section 113-A disposed within the plasma chamber 110, the first section having a first surface 148 exposed to the plasma 114. As shown, the first surface 148 may be curved to motivate the plasma 114 towards the longitudinal axis 'L.' The first section 113-A further includes a second surface 150, opposite the first surface 148, the second surface 150 remaining generally unexposed to the plasma 114. As further shown, and first section 113-A includes first and second ends 152, 154 adjacent respective side walls 132 and 134 of the plasma chamber 110. Although not shown, in some embodiments, the first and second ends 152, 154 are in contact with an inner surface 166 of the plasma chamber 110 to form a seal therebetween.

The end plate 113 further includes a second section 113-B coupled to the first section 113-A, for example, in a perpendicular arrangement. As shown, the second section 113-B extends outside of the plasma chamber 110, beyond the first end wall 136. The second section 113-B may be provided with a vacuum feedthrough 157 for coupling and sealing the second section 113-B of the end plate 113 to the first end wall 136. The vacuum feedthrough 157 provides a vacuum seal as well as motion and electrical isolation for bias voltage. Although not shown, the second section 113-B may be driven by a mechanical device configured to actuate the end plate 113 to an intended axial position within the plasma chamber 110.

During operation, the end plate 113 may be actuated from a first position, for example, proximate the first end wall 136, to a second position closer to the exit aperture 139. As the end plate 113 moves towards the second end wall 138, the first section 113-A increases a density and temperature of the plasma 114 by reducing a volume available to the plasma 114 within the plasma chamber 110. In the first position, the plasma volume is set to the maximum, for example, in the case molecular ion species are desired (e.g. $BF_2^+$, $N_2^+$, dimers, trimers, etc.). In contrast, in the case monoatomic ion species (e.g. $B^+$, $N^+$, $C^+$, etc.) are desired, the plasma chamber volume is set to the minimum by moving the end plate 113 towards the second end wall 138 in order to maximize the power density and change the ratio of plasma volume to boundary area.

In some embodiments, the second section 113-B may be further coupled to a voltage source 160 for providing a voltage (negative or positive) to the end plate 113. The voltage source 160 may provide a bias voltage to the end plate 113 in order to further control the plasma characteristics. For example, the end plate 113 may be negatively biased for electrostatic confinement, and positively biased for plasma potential control. Furthermore, in the case the end plate 113 contains a dopant element such as Boron or Phosphorous, the beam current may be increased. The bias voltage on the end plate 113, whether negative DC or RF, causes sputtering of the end plate. Sputtered dopant elements are then ionized in the plasma 114, and extracted as an ion beam 116. Unlike DC bias, RF bias polarity cannot be switched between positive and negative, and the RF net bias (self-bias) is generally negative. RF bias is useful for sputtering the dopant material included in electrically insulating materials.

Additionally, the RF antenna 140 may simultaneously move towards the second end wall 138 along the exterior surface 142 of the plasma chamber 110. In one embodiment, the end plate 113 and the RF antenna 140 may move together in a fixed or proportional amount. In another embodiment, the end plate 113 and the RF antenna 140 may move independent of one another.

In some embodiments, the end plate 113 can be made of either an electrically conducting material, such as doped Si, doped SiC, Aluminum, or Tungsten, or an insulating material, such as Si, quartz or ceramics. In addition, in the case the end plate 113 is made of an electrically conducting material, the end plate 113 may be electrically biased to further control characteristics of the plasma, as described above. The RF bias on the end plate 113 can be applied to electrically conducting and insulating materials.

Figure 3:
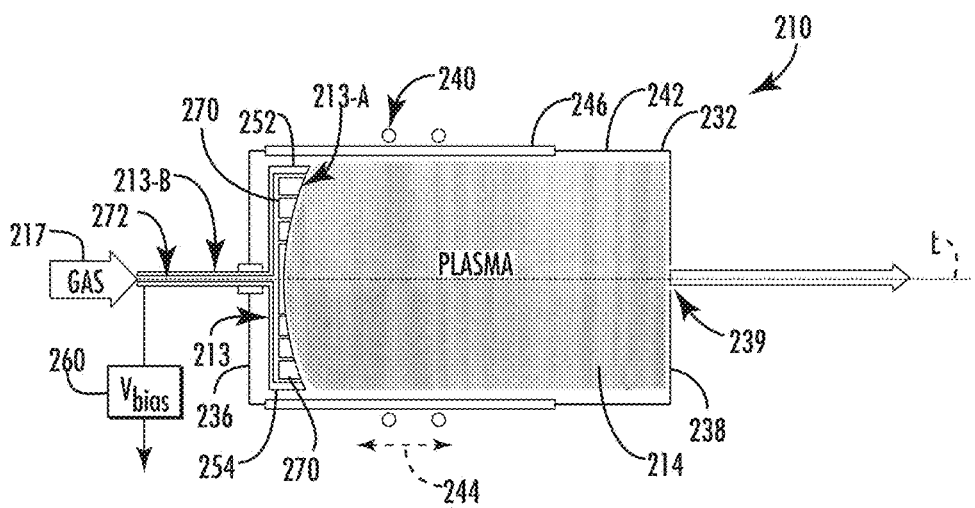
FIG. 3 is a side cross-sectional view of a plasma chamber in accordance with an embodiment of the present disclosure.

Turning now to FIG. 3, a plasma chamber 210 according another exemplary embodiment of the disclosure will be described in greater detail. In this embodiment, the end plate 213 may also be used as a gas baffle for introducing a dopant gas 217 to the plasma 214. Specifically, the end plate 213 is provided with a plurality of internal fluid passageways 270 extending between first and second ends 252, 254 for introducing the dopant gas 217 to the plasma 214 within the plasma chamber 210. As shown, the end plate 213 includes first and second sections 213A-B, wherein the second section 213-B initially receives and transports the dopant gas 217 via a central orifice 272. The dopant gas 217 is then transported to the plurality of internal fluid passageways 270, where the dopant gas 217 is conducted to the plasma 214. In one embodiment, the plurality of internal fluid passageways 270 are evenly spaced between the first and second ends 252, 254 of the end plate 213 so as to more uniformly deliver the dopant gas 217 to the plasma 214. Furthermore, by positioning the plurality of internal fluid passageways 270 within the end plate 213, the dopant gas 217 may be introduced into the plasma 214 in an area closer to an RF antenna 240, thus improving power coupling.

Similar to the plasma chamber 110 shown in FIG. 2, the plasma chamber 210 further includes the RF antenna 240 adjacent an RF window 246 along an exterior surface 242 of the plasma chamber 210, wherein the RF antenna is connected to a RF supply (not shown). In exemplary embodiments, the RF antenna 240 is actuable between a first end wall 236 and a second end wall 238, for example, as indicated by arrow 244.

Furthermore, the end plate 213 is actuable along the longitudinal axis 'L' of the plasma chamber 210, between the first end wall 236 and the second end wall 238, to adjust a volume of the plasma 214 contained therein. The second section 213-B may be coupled to a mechanical device (not shown) for actuating the end plate 213 to an intended axial position within the plasma chamber 210. In some embodiments, the second section 213-B may be further coupled to a voltage source 260 for providing a voltage (e.g., negative or positive DC, pulsed DC or RF) to the end plate 213.

During operation, the end plate 213 may be actuated from a first position, for example, proximate the first end wall 236, to a second position closer to an exit aperture 239. As the end plate 213 moves towards the second end wall 238 along the longitudinal axis 'L,' the first section 213-A pushes against the plasma 214, moving the plasma 214 towards the second end wall 238. As a result, a volume of the plasma 214 decreases, causing a density and temperature of the plasma 214 within the plasma chamber 210 to increase. Conversely, the end plate 213 may also be actuated towards the first end wall 236 to increase a volume of the plasma 214, causing the density and temperature of the plasma 214 within the plasma chamber 210 to decrease. As such, the position of the end plate 213 can be dynamically adjusted to optimize ion species and to promote the intended negative ion species within the plasma 214.

Additionally, the RF antenna 240 may simultaneously move towards the second end wall 238 along the exterior surface 242 of the plasma chamber 210. In one embodiment, the end plate 213 and the RF antenna 240 may move together in a fixed or proportional amount. In another embodiment, the end plate 213 and the RF antenna 240 are independently actuable.

Figure 4A:
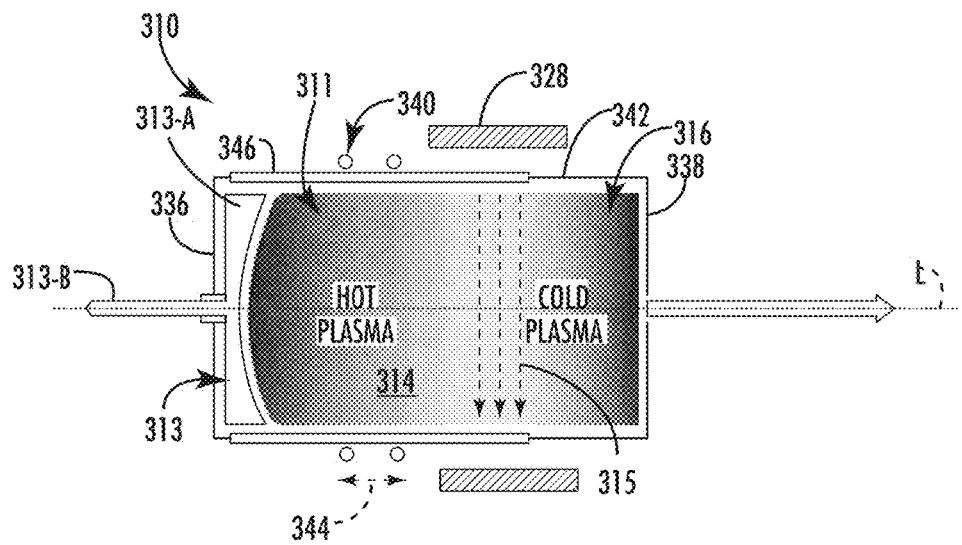
FIG. 4A is a side cross-sectional view of a plasma chamber in accordance with an embodiment of the present disclosure.
Figure 4B:
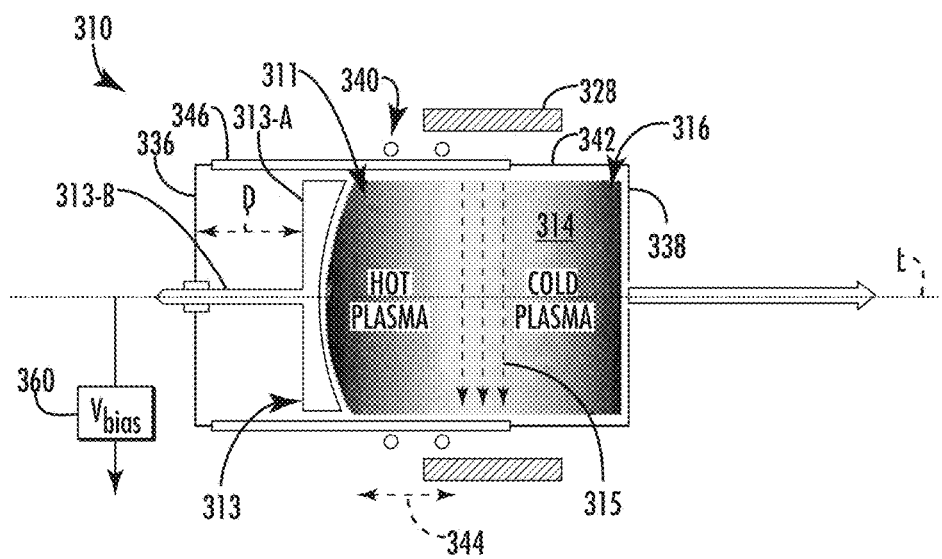
FIG. 4B is a side cross-sectional view of the plasma chamber of FIG. 4A in accordance with an embodiment of the present disclosure.

Turning now to FIGS. 4A-B, a plasma chamber 310 according another exemplary embodiment of the disclosure will be described in greater detail. In this embodiment, the plasma chamber 310 may be part of a negative ion source. As such, the plasma chamber 310 includes a first region 311 (e.g., a hot plasma region), also known as a driver region, and a second region 316 (e.g., a colder region) separated, generally, by magnetic field lines 315 generated by a filter magnet 328 disposed proximate the plasma chamber 310. In some embodiments, the filter magnet 328 can be a permanent magnet or coil magnet.

As shown, the plasma chamber 310 further includes an RF antenna 340 (e.g., a coil) provided adjacent an RF window 346 along an exterior surface 342 of the plasma chamber 310, the RF antenna 340 connected to an RF supply (not shown). In exemplary embodiments, the RF antenna 340 is actuable between a first end wall 336 and a second end wall 338, for example, along the exterior surface 342 of the plasma chamber 310, as indicated by arrow 344.

In exemplary embodiments, the end plate 313 may be actuable along the longitudinal axis 'L' of the plasma chamber 310, between the first end wall 336 and the second end wall 338, to adjust a volume of the plasma 314 contained therein. For example, the end plate 313 may be actuated from a first position proximate the first end wall 336, as demonstrated in FIG. 4A, to a second position further along the longitudinal axis 'L' within the plasma chamber 310, as demonstrated in FIG. 4B. As the end plate 313 moves towards the second end wall 338, e.g., by a distance 'D,' the end plate 313-A increases a density and temperature of the plasma 314 by reducing a volume of the plasma 314 within the plasma chamber 310. As a result, the hot plasma within the first region 311 causes a higher electron temperature and density, thus producing more radicals present in the colder region, second region 316. The radicals are then converted to negative ions and extracted from the plasma chamber 310.

In one example, the plasma chamber 310 may generate an H⁻ ion beam. The end plate 313 may be positioned in the position shown in FIG. 4B to promote high-density and high electron temperature ($T_e$) of the plasma 314. A negative DC voltage can be simultaneously applied by the voltage source 360 to the end plate 313 to generate the hyper-thermal neutrals, thus promoting H⁻ generation via dissociative attachment. In other embodiments, the voltage source may provide a negative pulsed DC or RF bias). For other negative ion species, such as He⁻, O⁻, Cl⁻, the volume of the plasma chamber 310 may be individually adjusted to promote optimal ion generation specific to individual ion species.

In some embodiments, the RF antenna 340 may simultaneously move towards the second end wall 338 along the exterior surface 342 of the plasma chamber 310. In one embodiment, the end plate 313 and the RF antenna 340 may move together in a fixed or proportional amount. In another embodiment, the end plate 313 and the RF antenna 340 are independently actuable.

Figure 5A:
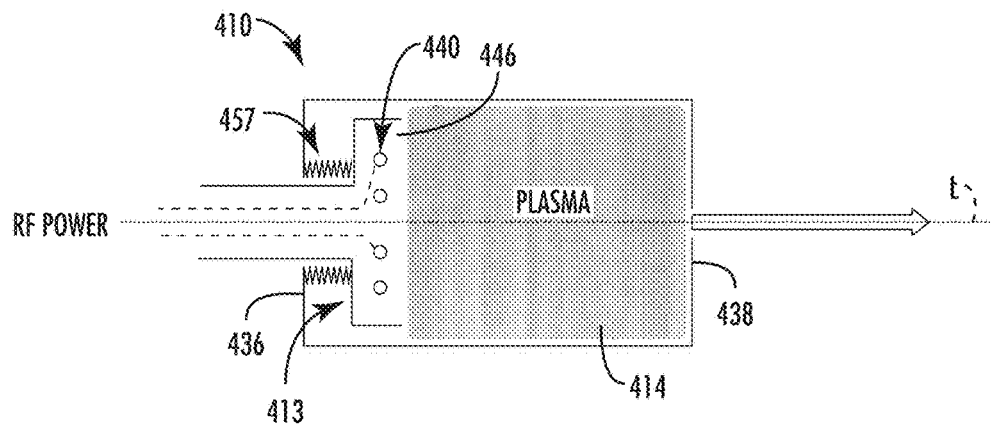
FIG. 5A is a side cross-sectional view of a plasma chamber in accordance with an embodiment of the present disclosure.
Figure 5B:
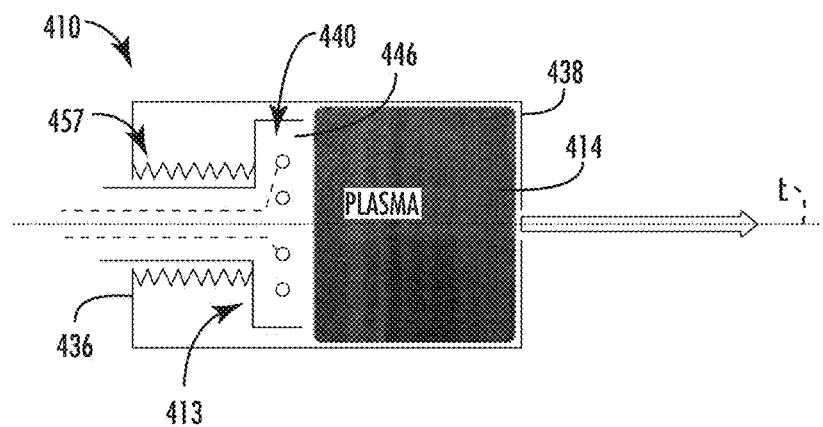
FIG. 5B is a side cross-sectional view of the plasma chamber of FIG. 5A in accordance with an embodiment of the present disclosure.

Turning to FIGS. 5A-B, a plasma chamber 410 according to another exemplary embodiment of the disclosure will now be described. Similar to the plasma chambers shown in FIGS. 1-4, the plasma chamber 410 includes an end plate 413 actuable along a longitudinal axis 'L' of the plasma chamber 410, between a first end wall 436 and a second end wall 438, to adjust a volume of a plasma 414 contained therein. During operation, the end plate 413 may be actuated from a first position, demonstrated in FIG. 5A, to a second position, demonstrated in FIG. 5B. As the end plate 413 moves towards the second end wall 438, the end plate 413 increases a density and temperature of the plasma 414 by reducing a volume of the plasma 414 within the plasma chamber 410. Conversely, the end plate 413 may also be actuated towards the first end wall 436 to increase a volume of the plasma 414, causing the density and temperature of the plasma 414 within the plasma chamber 410 to decrease. As such, the position of the end plate 413 can be dynamically adjusted to optimize ion species and to promote the intended negative ion species within the plasma 414.

In this embodiment, an RF antenna 440 (e.g., a coil) and an RF window 446 are provided within the end plate 413. The RF antenna 440 will therefore simultaneously move towards the second end wall 438 with the end plate 413. As shown, the RF window 446 is adjacent to and generally exposed to the plasma 414 within the plasma chamber 410. The plasma chamber 410 may further include a vacuum feedthrough 457 for coupling/sealing the end plate 413 to the first end wall 436. In some embodiments, the vacuum feedthrough includes an expandable baffle for allowing a flexible seal between the end plate 413 and the first end wall 432 of the plasma chamber 410.

Figure 6:
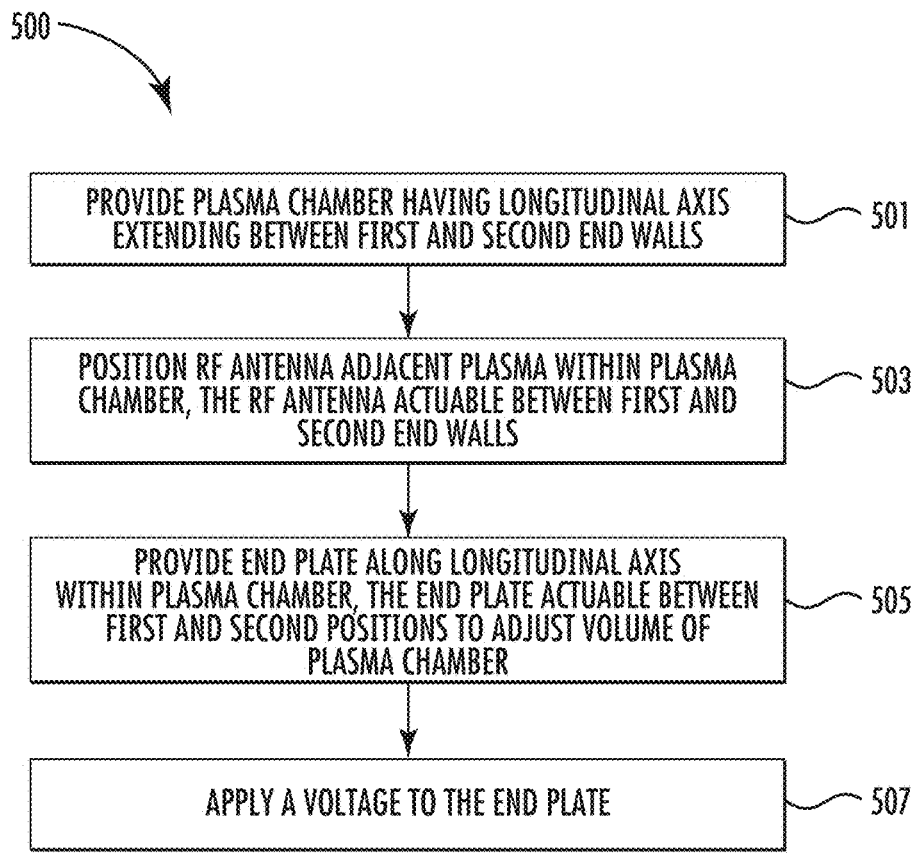
FIG. 6 is a flowchart illustrating an exemplary method in accordance with embodiments of the present disclosure.

Referring now to FIG. 6, a flow diagram illustrating an exemplary method, method 500, for adjusting a volume of a plasma chamber in accordance with the present disclosure is shown. The method 500 will be described in conjunction with the representations shown in FIGS. 1-5B.

Method 500 includes providing a plasma chamber having a longitudinal axis extending between a first end wall and a second end wall, as shown in block 501. In some embodiments, the plasma chamber further includes first and second side walls, and an exit aperture formed through the second end wall. In some embodiments, the plasma chamber contains a plasma. In some embodiments, a vacuum feedthrough couples the second section of the end plate to the second end wall of the plasma chamber.

Method 500 further includes positioning an RF antenna adjacent the plasma within the plasma chamber, as shown at block 503. In some embodiments, the RF antenna is actuable between the first and second end walls of the plasma chamber. In some embodiments, the RF antenna is a coil. In some embodiments, the plasma chamber further includes an RF window formed along a sidewall of the plasma chamber, wherein the RF antenna is disposed adjacent the RF window.

Method 500 further includes providing an end plate disposed along the longitudinal axis within the plasma chamber, as shown at block 505, wherein the end plate is actuable between a first position and a second position to adjust a volume of a plasma. In some embodiments, the end plate includes a first section disposed within the plasma chamber, the first section extending between the first and second side walls of the plasma chamber. The end plate further includes a second section coupled to the first section, the second section extending outside of the plasma chamber.

Method 500 may further include an optional process of applying a voltage to the end plate, as shown at block 507. In some embodiments, the voltage is applied to the second section of the end plate by a voltage source. In some embodiments, the voltage to the end plate can be DC (positive/negative), pulsed DC (positive/negative) or RF.

In view of the foregoing, at least the following advantages are achieved by the embodiments disclosed herein. A first advantage includes the ability to provide positive and negative ion sources with adjustable volume control in existing implantation tools. A second advantage includes the ability to provide additional control knobs in existing processing tools for controlling plasma characteristics. A third advantage includes the applicability to multiple species such as $B^+$, $BF_2^+$, $P^+$, and $As^+$, molecular species, dimers, trimers, as well as negative ion species.

While certain embodiments of the disclosure have been described herein, the disclosure is not limited thereto, as the disclosure is as broad in scope as the art will allow and the specification may be read likewise. Therefore, the above description are not to be construed as limiting. Those skilled in the art will envision other modifications within the scope and spirit of the claims appended hereto.

The invention claimed is:

1. An ion source comprising:
    a plasma chamber having a longitudinal axis extending between a first end wall and a second end wall; and
    an end plate disposed within the plasma chamber, the end plate actuated along the longitudinal axis between a first position and a second position to adjust a volume of a plasma, wherein the end plate includes an internal fluid passageway operable to deliver a gas into the plasma chamber.

2. The ion source of claim 1, further comprising a radio frequency (RF) energy source operable to provide RF energy to the plasma.

3. The ion source of claim 2, wherein the RF energy source is an RF antenna, and wherein the RF antenna is disposed adjacent an RF window of the plasma chamber.

4. The ion source of claim 1, further comprising a voltage source coupled to the end plate.

5. The ion source of claim 1, the internal fluid passageway comprising a plurality of fluid passageways.

6. The ion source of claim 5, the internal fluid passageway comprising a central orifice fluidly connected with the plurality of fluid passageways.

7. The ion source of claim 6, wherein the end plate comprises:
    a first section disposed within the plasma chamber, the first section extending to a sidewall of the plasma chamber, wherein the first section contains the plurality of fluid passageways; and
    a second section coupled to the first section, the second section extending outside of the plasma chamber, wherein the second section contains the central orifice.

8. The ion source of claim 7, further comprising an exit aperture formed through a first end wall of the plasma chamber, the exit aperture disposed along the longitudinal axis.

9. The ion source of claim 7, further comprising a vacuum feedthrough coupling the second section of the end plate to a second end wall of the plasma chamber.

10. A plasma chamber comprising:
    a housing comprising a side wall, a first end wall, and a second end wall, wherein the second end wall includes an exit aperture for delivering an ion beam from the plasma chamber; and
    an end plate disposed within the plasma chamber, the end plate actuated along a longitudinal axis between a first position and a second position to adjust a volume of a plasma, wherein the end plate includes an internal fluid passageway operable to deliver a gas into the plasma chamber.

11. The plasma chamber of claim 10, wherein the end plate is electrically coupled to a voltage source.

12. The plasma chamber of claim 10, further comprising a radio frequency (RF) energy source operable to provide RF energy to the plasma.

13. The plasma chamber claim 12, wherein the RF antenna is disposed within the end plate.

14. The plasma chamber of claim 10, the internal fluid passageway comprising:
    a plurality of fluid passageways; and
    a central orifice fluidly connected with the plurality of fluid passageways.

15. The plasma chamber of claim 14, wherein the end plate comprises:
    a first section disposed within the plasma chamber, the first section having a first surface exposed to plasma within the plasma chamber, a second surface opposite the first surface, the second surface unexposed to the plasma within the plasma chamber, and first and second ends adjacent the side wall of the plasma chamber; and a second section coupled to the first section, the second section extending outside of the plasma chamber.

16. The plasma chamber of claim 15, wherein the plurality of fluid passageways is disposed within the first section of the end plate, and wherein the central orifice is disposed within the second section of the end plate.

17. A method for adjusting a volume of plasma within a plasma chamber, the method comprising:

providing a plasma chamber having a longitudinal axis extending between a first end wall and a second end wall;

providing an end plate within the plasma chamber, the end plate actuable along the longitudinal axis between a first position and a second position to adjust a volume of the plasma; and introducing a gas to the plasma chamber through an internal fluid passageway formed through the end plate.

18. The method of claim 17, further comprising applying a voltage to the end plate.

19. The method of claim 17, further comprising actuating the end plate and the RF antenna towards the second end wall to increase a density of the plasma, the second end wall including an exit aperture for delivering an ion beam from the plasma chamber.

20. The method of claim 17, further comprising:

delivering the gas through a central orifice located within a first section of the end plate; and delivering the gas from the central orifice to a plurality of fluid passageways located within a second section of the end plate.

* * * * *